United States Patent
Kim et al.

(10) Patent No.: US 9,039,943 B2
(45) Date of Patent: May 26, 2015

(54) CONDUCTIVE PASTE AND ELECTRONIC DEVICE AND SOLAR CELL INCLUDING AN ELECTRODE FORMED USING THE CONDUCTIVE PASTE

(75) Inventors: Se Yun Kim, Seoul (KR); Eun-Sung Lee, Seoul (KR); Sang-Soo Jee, Hwaseong-si (KR); Do-Hyang Kim, Seoul (KR); Ka-Ram Lim, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 401 days.

(21) Appl. No.: 13/404,399

(22) Filed: Feb. 24, 2012

(65) Prior Publication Data

US 2012/0247550 A1  Oct. 4, 2012

(30) Foreign Application Priority Data

Mar. 28, 2011  (KR) .................. 10-2011-0027613

(51) Int. Cl.
*H01B 1/02* (2006.01)
*H01B 1/22* (2006.01)
*H01L 31/0224* (2006.01)

(52) U.S. Cl.
CPC .......... *H01B 1/22* (2013.01); *H01L 31/022425* (2013.01); *Y02E 10/50* (2013.01)

(58) Field of Classification Search
CPC ............ H01B 1/16; H01B 1/22; H05K 1/095; H01L 31/022; H01L 31/022425; H01L 31/02645; C22C 45/10
USPC ............. 252/512, 513, 514, 519.12; 136/252, 136/256; 148/528
See application file for complete search history.

(56) References Cited

U.S. PATENT DOCUMENTS

| | | | | |
|---|---|---|---|---|
| 4,434,084 A | * | 2/1984 | Hicks et al. .................... | 252/512 |
| 2008/0251164 A1 | * | 10/2008 | Lohwongwatana et al. .. | 148/528 |
| 2009/0211626 A1 | * | 8/2009 | Akimoto ........................ | 136/252 |
| 2010/0037990 A1 | | 2/2010 | Suh | |
| 2011/0114170 A1 | * | 5/2011 | Lee et al. ....................... | 136/256 |

FOREIGN PATENT DOCUMENTS

| JP | 07-054086 | * | 2/1995 | ............. C22C 14/00 |
|---|---|---|---|---|
| JP | 2009099371 A | | 5/2009 | |

(Continued)

OTHER PUBLICATIONS

Journal of the Electrochemical Society, 153, (1) A5-A11, (2006): Effect of Ag particle size in thick-film Ag paste on the electrical and physical properties of screen printed contacts and silicon solar cells.

*Primary Examiner* — Khanh Tuan Nguyen
(74) *Attorney, Agent, or Firm* — Harness, Dickey & Pierce, PLC

(57) ABSTRACT

According to example embodiments, a conductive paste includes a conductive component that contains a conductive powder and a titanium (Ti)-based metallic glass. The titanium-based metallic glass has a supercooled liquid region of about 5K or more, a resistivity after crystallization that is less than a resistivity before crystallization by about 50% or more, and a weight increase by about 0.5 mg/cm$^2$ or less after being heated in a process furnace at a firing temperature. According to example embodiments, an electronic device and a solar cell may include at least one electrode formed using the conductive paste according to example embodiments.

24 Claims, 7 Drawing Sheets

(56) References Cited

FOREIGN PATENT DOCUMENTS

| JP | 2009138266 A | 6/2009 |
| JP | 2010018878 A | 1/2010 |
| KR | 20020037772 A | 5/2002 |
| WO | WO-01/31085 A2 | 5/2001 |

\* cited by examiner

CONDUCTIVE PASTE AND ELECTRONIC DEVICE AND SOLAR CELL INCLUDING AN ELECTRODE FORMED USING THE CONDUCTIVE PASTE

CROSS-REFERENCE TO RELATED APPLICATION

This application claims priority under 35 U.S.C. §119 to Korean Patent Application No. 10-2011-0027613, filed in the Korean Intellectual Property Office on Mar. 28, 2011, the entire contents of which are incorporated herein by reference.

BACKGROUND

1. Field

Example embodiments relate to a conductive paste, an electronic device including an electrode formed using the conductive paste, and/or a solar cell including an electrode formed using the conductive paste.

2. Description of the Related Art

A solar cell is a photoelectric conversion device that transforms light (e.g., solar energy) into electrical energy. Solar cells are attracting attention as a potentially infinite and pollution-free next generation energy source.

A solar cell may include p-type and n-type semiconductors. A solar cell may produce an electron-hole pair ("EHP") from light absorbed in a photoactive layer of the semiconductors of the solar cell. Solar cells may produce electrical energy by transferring electrons and holes to the n-type and p-type semiconductors, respectively, and then collecting the electrons and holes in electrodes of the solar cell.

A solar cell desirably has as high efficiency as possible for producing electrical energy from solar energy. In order to improve this efficiency, the solar cell desirably absorbs light with less loss so that it may produce as many electron-hole pairs as possible, and then collects the produced charges with as little loss as possible.

An electrode may be fabricated by a deposition method. A deposition method may include a complicated process that may have a high cost and may take a long time. Accordingly, a simplified process, such as screen printing a conductive paste including a conductive material may be desired to fabricate an electrode.

SUMMARY

Example embodiments relate to a conductive paste, and/or an electronic device including an electrode formed using the conductive paste, and/or a solar cell including an electrode formed using the conductive paste.

A conductive paste may include a conductive powder as a main component and the conductive powder may contain a low-resistance element such as silver (Ag). However, the cost of the conductive powder may account for a great part of the process cost since the conductive power may be an expensive element.

According to example embodiments, the cost of a conductive paste may be reduced by reducing the amount of the conductive powder in the conductive paste.

According to example embodiments, an electronic device includes at least one electrode including a product of a conductive paste according to example embodiments.

According to example embodiments, a solar cell includes at least one electrode including a product of a conductive paste according to example embodiments.

According to example embodiments, a conductive paste includes a conductive component containing a conductive powder and a titanium (Ti)-based metallic glass. The titanium-based metallic glass has a supercooled liquid region of about 5K or more, a resistivity after crystallization that is less than a resistivity before crystallization by about 50% or more, and a weight increase by about 0.5 mg/cm$^2$ or less after being heated in a process furnace at a firing temperature.

The titanium-based metallic glass may have a supercooled liquid region of about 5 to about 200K.

The titanium-based metallic glass may have resistivity after crystallization of about 200 μΩcm or less.

The titanium-based metallic glass may be crystallized by heating in a process furnace at about 300° C. to about 800° C. in air.

The firing temperature may be about 300 to about 1000° C.

The titanium-based metallic glass may include one of $Ti_{50}Cu_{50}$, $Ti_{57}Cu_{43}$, $Ti_{49.75}Cu_{49.75}Al_{0.5}$, $Ti_{49.5}Cu_{49.5}Al_1$, $Ti_{49}Cu_{49}Al_2$, $Ti_{49.75}Cu_{49.75}Nb_{0.5}$, $Ti_{49.5}Cu_{49.5}Nb_1$, $Ti_{49}Cu_{49}Nb_2$, $Ti_{50}Cu_{35}Ni_{15}$, $Ti_{50}Cu_{32}Ni_{15}Sn_3$, $Ti_{50}Cu_{30}Ni_{15}Sn_5$, $Ti_{50}Cu_{25}Ni_{15}Sn_5Zr_5$, $Ti_{50}Cu_{42.5}Ni_{7.5}$, $Ti_{47.5}Cu_{42.5}Ni_{7.5}Zr_{2.5}$, $Ti_{45}Cu_{40}Ni_5Sn_5Zr_5$, and a combination thereof.

The conductive powder may include one of silver (Ag), silver (Ag) alloy, aluminum (Al), aluminum (Al) alloy, copper (Cu), copper (Cu) alloy, nickel (Ni), nickel (Ni) alloy, and a combination thereof.

The conductive powder and titanium-based metallic glass may be included in amounts of about 5 wt % to about 95 wt % and about 5 wt % to about 95 wt %, respectively, based on the total amount of the conductive component.

The conductive paste may further include a binder.

The binder may include one of glass frit, metallic glass, and a combination thereof.

The titanium-based metallic glass may include a composition represented by the formula, $Ti_xCu_yM_z$, where M may be an element including one of aluminum (Al), niobium (Nb), nickel (Ni), tin (Sn), and zirconium (Zr). The value for x may range from about 45.0 to about 60.0. The value for y may range from about 25.0 to about 50.0. The value for z may range from about 0.5 to about 15.0. The sum of x, y, and z is equal to or less than 1.0.

In the above chemical formula $Ti_xCu_yM_z$, M may be nickel (Ni), the value for x may be a number ranging from about 45.0 to about 50.0, the value for y may be a number ranging from about 25.0 to about 42.5, and the value for z may be a number ranging from about 7.5 to about 15.0.

The titanium-based metallic glass may be an amorphous alloy including titanium (Ti) as a main component and at least one element other than titanium. The at least one element other than titanium may include at least one of nickel (Ni), tin (Sn), zirconium (Zr), silicon (Si), silver (Ag), gold (Au), calcium (Ca), beryllium (Be), magnesium (Mg), sodium (Na), molybdenum (Mo), tungsten (W), zinc (Zn), potassium (K), lithium (Li), iron (Fe), palladium (Pd), platinum (Pt), rubidium (Rb), chromium (Cr), and strontium (Sr).

According to example embodiments, an electrode may include a fired product of a conductive paste according to example embodiments.

According to example embodiments, an electronic device includes at least one electrode including a fired product of a conductive paste that includes a conductive component including a conductive powder and a titanium (Ti)-based metallic glass. The titanium-based metallic glass has a supercooled liquid region of about 5K or more, a resistivity after crystallization that is less than a resistivity before crystallization by about 50% or more, and a weight increase by about 0.5 mg/cm² or less after being heated in a process furnace at a firing temperature.

The titanium-based metallic glass may have a supercooled liquid region of about 5 to about 200° C. and resistivity after crystallization of about 200 μΩcm or less.

The titanium-based metallic glass may include one of $Ti_{50}Cu_{50}$, $Ti_{57}Cu_{43}$, $Ti_{49.75}Cu_{49.75}Al_{0.5}$, $Ti_{49.5}Cu_{49.5}Al_1$, $Ti_{49}Cu_{49}Al_2$, $Ti_{49.75}Cu_{49.75}Nb_{0.5}$, $Ti_{49.5}Cu_{49.5}Nb_1$, $Ti_{49}Cu_{49}Nb_2$, $Ti_{50}Cu_{35}Ni_{15}$, $Ti_{50}Cu_{32}Ni_{15}Sn_3$, $Ti_{50}Cu_{30}Ni_{15}Sn_5$, $Ti_{50}Cu_{25}Ni_{15}Sn_5Zr_5$, $Ti_{50}Cu_{42.5}Ni_{7.5}$ $Ti_{47.5}Cu_{42.5}Ni_{7.5}Zr_{2.5}$, $Ti_{45}Cu_{40}Ni_5Sn_5Zr_5$, and a combination thereof.

The conductive powder and titanium-based metallic glass may be included in amounts of about 5 wt % to about 95 wt % and about 5 wt % to about 95 wt %, respectively, based on the total amount of the conductive component.

According to example embodiments, a solar cell includes a semiconductor layer and an electrode electrically connected to the semiconductor layer. The electrode may include a fired product of conductive paste that includes a conductive component including a conductive powder and a titanium-based metallic glass. The titanium-based metallic glass has a supercooled liquid region of about 5K or more, a resistivity after crystallization that is less than a resistivity before crystallization by about 50% or more, and a weight increase by about 0.5 mg/cm² or less after being heated in a process furnace at a firing temperature.

The titanium-based metallic glass may have a supercooled liquid region of about 5 to about 200K.

The titanium-based metallic glass may have resistivity after crystallization of about 200 μΩcm or less.

The titanium-based metallic glass may include one of $Ti_{50}Cu_{50}$, $Ti_{57}Cu_{43}$, $Ti_{49.75}Cu_{49.75}Al_{0.5}$, $Ti_{49.5}Cu_{49.5}Al_1$, $Ti_{49}Cu_{49}Al_2$, $Ti_{49.75}Cu_{49.75}Nb_{0.5}$, $Ti_{49.5}Cu_{49.5}Nb_1$, $Ti_{49}Cu_{49}Nb_2$, $Ti_{50}Cu_{35}Ni_{15}$, $Ti_{50}Cu_{32}Ni_{15}Sn_3$, $Ti_{50}Cu_{30}Ni_{15}Sn_5$, $Ti_{50}Cu_{25}Ni_{15}Sn_5Zr_5$, $Ti_{50}Cu_{42.5}Ni_{7.5}$ $Ti_{47.5}Cu_{42.5}Ni_{7.5}Zr_{2.5}$, $Ti_{45}Cu_{40}Ni_5Sn_5Zr_5$, and a combination thereof.

The conductive powder may include one of silver (Ag), silver (Ag) alloy, aluminum (Al), aluminum (Al) alloy, copper (Cu), copper (Cu) alloy, nickel (Ni), nickel (Ni) alloy, and a combination thereof.

The at least one electrode may include a buffer layer adjacent to one region of the semiconductor layer, and an electrode portion electrically connected to another region of the semiconductor layer.

The buffer layer may include one of glass frit, metallic glass, and a combination thereof.

BRIEF DESCRIPTION OF THE DRAWINGS

The foregoing and other features and advantages of example embodiments will be apparent from the more particular description of non-limiting embodiments, as illustrated in the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
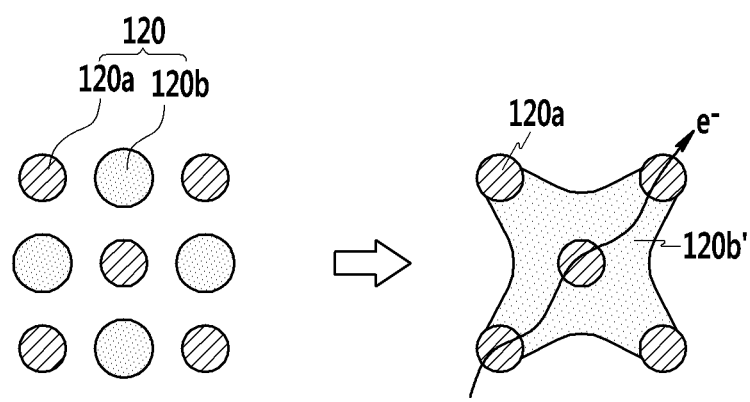
FIG. 1 is a schematic diagram showing a wettability of conductive powder and metallic glass when a conductive paste according to example embodiments is heated at a temperature within a supercooled liquid region.

Example embodiments will now be described more fully with reference to the accompanying drawings, in which some example embodiments are shown. Example embodiments, however, may be embodied in many different forms and should not be construed as limited to example embodiments set forth herein; rather, these example embodiments are provided so that this disclosure will be thorough and complete, and will fully convey the scope of example embodiments to those of ordinary skill in the art. In the drawings, the thickness of layers, films, panels, regions, etc., are exaggerated for clarity. Like reference numerals designate like elements throughout the specification, and thus their description may be omitted.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, the term 'element' refers to a metal and/or a semimetal.

First, a conductive paste according to example embodiments is described.

The conductive paste according to example embodiments includes a conductive component and an organic vehicle.

The conductive component includes a conductive powder and a titanium (Ti)-based metallic glass.

The conductive powder may be a silver (Ag)-containing metal such as silver or a silver alloy, an aluminum (Al)-containing metal such as aluminum or an aluminum alloy, a copper (Cu)-containing metal such as copper (Cu) or a copper alloy, a nickel (Ni)-containing metal such as nickel (Ni) or a nickel alloy, or a combination thereof. However, the conductive powder is not limited thereto and may include other metals, metal alloys, and at least one additive other than the metals.

The conductive powder may have a size (e.g., average particle size) ranging from about 1 nanometers (nm) to about 50 micrometers (μm), specifically about 0.1 μm to about 50 μm.

The titanium-based metallic glass may be an amorphous alloy including a main component of titanium (Ti) and having a disordered atomic structure of the titanium and at least one element other than titanium. The element other than titanium may be at least one selected from, for example, copper (Cu), aluminum (Al), niobium (Nb), nickel (Ni), tin (Sn), zirconium (Zr), silicon (Si), silver (Ag), gold (Au), calcium (Ca), beryllium (Be), magnesium (Mg), sodium (Na), molybdenum (Mo), tungsten (W), zinc (Zn), potassium (K), lithium (Li), iron (Fe), palladium (Pd), platinum (Pt), rubidium (Rb), chromium (Cr), and strontium (Sr), but example embodiments are not limited thereto.

The metallic glass has low resistivity compared to some general glasses such as silicates.

The paste may include the titanium-based metallic glass by being substituted with a part of conductive powder. The conductive powder such as a silver (Ag)-containing metal accounts for a great part of the process cost since it the conductive powder generally an expensive element compared to the titanium-based metallic glass, so the relatively cheap titanium-based metallic glass may be partially substituted for the conductive powder.

The conductive powder and titanium-based metallic glass may be included in amounts of about 5 wt % to about 95 wt % and about 5 wt % to about 95 wt % based on the total amount of the conductive component, respectively. The conductive powder and titanium-based metallic glass may be included in amounts of about 50 wt % to about 95 wt % and about 5 wt % to about 50 wt % based on the total amount of the conductive component, respectively.

In order to partially substitute the titanium-based metallic glass with a part of the conductive powder, the following conditions may be satisfied.

First, the titanium-based metallic glass may have a supercooled liquid in a desired (or alternatively predetermined) region. The supercooled liquid region is a region between a glass transition temperature (Tg) and a crystallization temperature (Tx) of the metallic glass where the metallic glass may have low viscosity, be plastically deformed in the supercooled liquid region, and shows liquid-like behavior.

Accordingly, the metallic glass in the supercooled liquid region may have wettability for the conductive powder. The wettability for the conductive powder is described with reference to FIG. 1.

FIG. 1 is a schematic diagram showing wettability of a conductive powder and a metallic glass when the conductive paste according to example embodiments is heated at a temperature within the supercooled liquid region.

Referring to FIG. 1, the conductive powder 120a and the metallic glass 120b are respectively present in a particle state at a temperature lower than a glass transition temperature (Tg) of the metallic glass 120b, but the metallic glass 120b' shows liquid-like behavior within the supercooled liquid region of the metallic glass when heated at a temperature above the glass transition temperature (Tg) of the metallic glass, so as to form a connection between the adjacent conductive powders. Thereby, it may ensure conductivity of the conductive paste 120.

The supercooled liquid region may be about 5K or more, for example, about 5 to about 200K.

The following Table 1 shows the supercooled liquid region of titanium-based metallic glass including a main component of titanium and a element selected from copper (Cu), aluminum (Al), niobium (Nb), nickel (Ni), tin (Sn), and zirconium (Zr). In Table 1, the column headers include the glass transition temperature (Tg), onset temperature of crystallization (Tx), and the supercooled liquid region (ΔTx).

TABLE 1

| | Tg (° C.) | Tx (° C.) | Δ Tx (° C.) |
|---|---|---|---|
| $Ti_{50}Cu_{50}$ | 403 | 449 | 46 |
| $Ti_{57}Cu_{43}$ | 394 | 450 | 56 |
| $Ti_{49.75}Cu_{49.75}Al_{0.5}$ | 385 | 430 | 45 |
| $Ti_{49.5}Cu_{49.5}Al_1$ | 390 | 432 | 42 |
| $Ti_{49}Cu_{49}Al_2$ | 396 | 443 | 47 |
| $Ti_{49.75}Cu_{49.75}Nb_{0.5}$ | 384 | 435 | 51 |
| $Ti_{49.5}Cu_{49.5}Nb_1$ | 387 | 432 | 45 |
| $Ti_{49}Cu_{49}Nb_2$ | 391 | 444 | 53 |
| $Ti_{50}Cu_{35}Ni_{15}$ | 430 | 464 | 34 |
| $Ti_{50}Cu_{32}Ni_{15}Sn_3$ | 431 | 473 | 42 |
| $Ti_{50}Cu_{30}Ni_{15}Sn_5$ | 439 | 475 | 36 |
| $Ti_{50}Cu_{25}Ni_{15}Sn_5Zr_5$ | 431 | 481 | 50 |
| $Ti_{50}Cu_{42.5}Ni_{7.5}$ | 420 | 447 | 27 |
| $Ti_{47.5}Cu_{42.5}Ni_{7.5}Zr_{2.5}$ | 407 | 440 | 33 |
| $Ti_{45}Cu_{40}Ni_5Sn_5Zr_5$ | 436 | 480 | 44 |

Second, the titanium-based metallic glass may have lower resistivity after crystallization than before crystallization. If the resistivity of a metallic glass increases after crystallization, the increased resistivity of the metallic glass after crystallization may reduce the total conductivity of the conductive paste, so it may be difficult to substitute a part of the conductive powder.

When the titanium-based metallic glass is crystallized by heating in a process furnace at about 300 to 800° C. under the air, the resistivity after crystallization may be decreased lower than the resistivity before crystallization by about 50% or more, for example, the resistivity may be decreased by about 50 to about 95%.

The titanium-based metallic glass may have resistivity after crystallization of about 200 μΩ*cm or less, for example, about 50 to about 150 μΩ*cm.

The following Table 2 shows the resistivity change (Δρ) of before and after crystallization of the various titanium-based metallic glass. In Table 2, the columns refer to the resistivity (ρ) before crystallization, and the resistivity after crystallization (ρ'), the resistivity change (Δρ).

TABLE 2

| | ρ (μΩcm, initial) | ρ' (μΩcm, 600° C.) | Δ ρ (ρ' − ρ) | Resistivity decrease ratio (%) |
|---|---|---|---|---|
| $Ti_{50}Cu_{50}$ | 324 | 77 | 247 | 76 |
| $Ti_{57}Cu_{43}$ | 329 | 99 | 230 | 70 |
| $Ti_{49.75}Cu_{49.75}Al_{0.5}$ | 341 | 94 | 247 | 72 |
| $Ti_{49.5}Cu_{49.5}Al_1$ | 314 | 96 | 218 | 69 |
| $Ti_{49}Cu_{49}Al_2$ | 330 | 88 | 242 | 73 |
| $Ti_{49.75}Cu_{49.75}Nb_{0.5}$ | 354 | 94 | 260 | 73 |
| $Ti_{49.5}Cu_{49.5}Nb_1$ | 336 | 102 | 234 | 70 |
| $Ti_{49}Cu_{49}Nb_2$ | 358 | 91 | 267 | 75 |
| $Ti_{50}Cu_{35}Ni_{15}$ | 452 | 126 | 326 | 72 |
| $Ti_{50}Cu_{32}Ni_{15}Sn_3$ | 454 | 119 | 335 | 74 |
| $Ti_{50}Cu_{30}Ni_{15}Sn_5$ | 339 | 142 | 197 | 58 |
| $Ti_{50}Cu_{25}Ni_{15}Sn_5Zr_5$ | 318 | 123 | 195 | 61 |
| $Ti_{50}Cu_{42.5}Ni_{7.5}$ | 323 | 77 | 246 | 76 |
| $Ti_{47.5}Cu_{42.5}Ni_{7.5}Zr_{2.5}$ | 297 | 63 | 234 | 79 |
| $Ti_{45}Cu_{40}Ni_5Sn_5Zr_5$ | 325 | 145 | 180 | 55 |

Third, the titanium-based metallic glass may have good oxidation resistance. Since the conductive paste is generally processed in air, it may be easily exposed to oxygen of air. When the metallic glass is easily oxidized, the conductivity of the conductive paste deteriorates. When the metallic glass has good oxidation resistance, the conductivity of the conductive paste may not be deteriorated.

The oxidation resistance of metallic glass may be determined by considering a weight increase of metallic glass when the metallic glass is heated in a process furnace to a firing temperature. The weight increase refers to the weight increase amount due to an oxide generated by the oxidation. Greater weight increase means a lesser oxidation resistance, and less weight increase means higher oxidation resistance.

The titanium-based metallic glass according to example embodiments may increase weight of about 0.5 mg/cm² or less at a firing temperature of the conductive paste, for example, about 300 to about 1000° C.

This is described with reference to FIG. 2A and FIG. 2B.

Figure 2A:
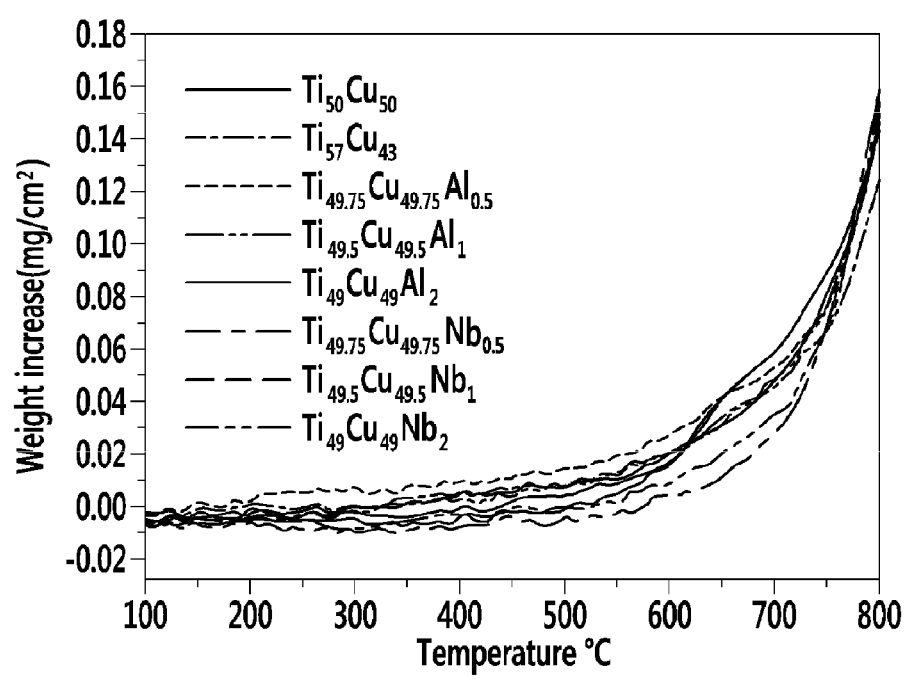
FIG. 2A and FIG. 2B are graphs showing a weight increase according to the temperature of a process furnace used to heat a titanium-based metallic glass.
Figure 2B:
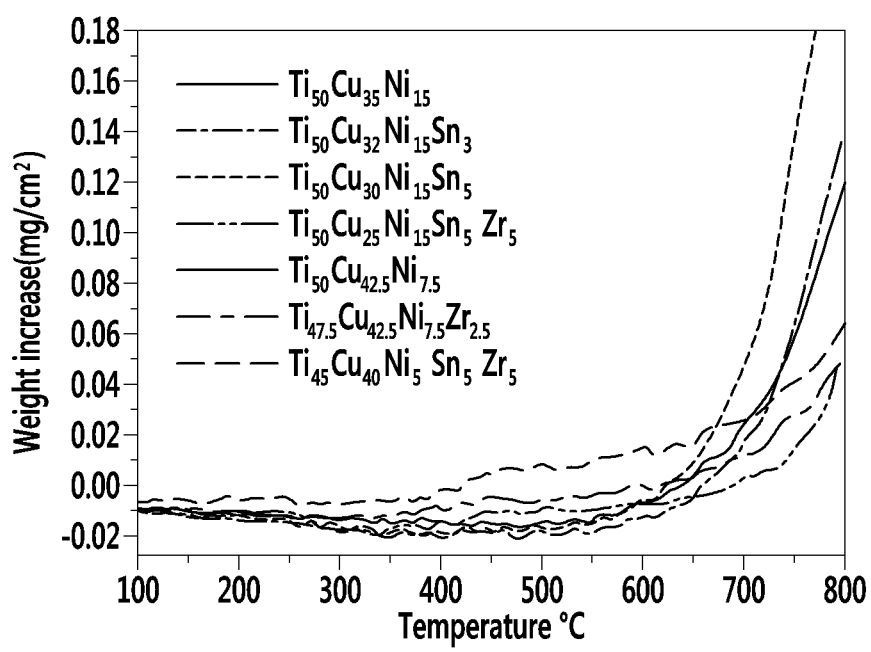

FIG. 2A and FIG. 2B are graphs showing weight increase according to the temperature of a process furnace used to heat a titanium-based metallic glass.

The titanium-based metallic glass in FIG. 2A and FIG. 2B may be prepared as following. First, metal ribbons having a thickness of about 100 micrometer or less and a size of about 5 mm×5 mm are prepared. Then, the metal ribbons are heated in the Thermogravimetric analyzer (TGA, Perkin Elmer TGA 4000) by a speed of about 40K/minute under the air and measured weight gain. Weight increase is obtained by dividing the weight gain into surface area.

Referring to FIG. 2A and FIG. 2B, when the titanium-based metallic glass ($Ti_{50}Cu_{50}$, $Ti_{57}Cu_{43}$, $Ti_{49.75}Cu_{49.75}Al_{0.5}$, $Ti_{49.5}Cu_{49.5}Al_1$, $Ti_{49}Cu_{49}Al_2$, $Ti_{49.75}Cu_{49.75}Nb_{0.5}$, $Ti_{49.5}Cu_{49.5}Nb_1$, $Ti_{49}Cu_{49}Nb_2$, $Ti_{50}Cu_{35}Ni_{15}$, $Ti_{50}Cu_{32}Ni_{15}Sn_3$, $Ti_{50}Cu_{30}Ni_{15}Sn_5$, $Ti_{50}Cu_{25}Ni_{15}Sn_5Zr_5$, $Ti_{50}Cu_{42.5}Ni_{7.5}$, $Ti_{47.5}Cu_{42.5}Ni_{7.5}Zr_{2.5}$, and $Ti_{45}Cu_{40}Ni_5Sn_5Zr_5$) is heated in a process furnace at a speed of about 40K/minute from room temperature to about 800° C., the weight increase is about 0.5 mg/cm² or less.

The organic vehicle may include an organic compound, an optional organic solvent, and optional additives known for use in the manufacture of conductive pastes for solar cells. The organic vehicle is combined with the conductive powder and the metallic glass primarily to provide a viscosity and rheology to the conductive paste effective for printing or coating the conductive paste. A wide variety of inert organic materials can be used, and can be selected by one of ordinary skill in the art without undue experimentation to achieve the desired viscosity and rheology, as well as other properties such as dispersibility of the conductive powder and the metallic glass, stability of conductive powder and the metallic glass and any dispersion thereof, drying rate, firing properties, and the like. Similarly, the relative amounts of the organic compound, any optional organic solvent, and any optional additive can be adjusted by one of ordinary skill in the art without undue experimentation in order to achieve the desired properties of the conductive paste.

The organic compound may include a polymer, for example, at least one selected from a (meth)acrylate resin; a cellulose resin such as ethyl cellulose; a phenol resin; an alcohol resin; a tetrafluoroethylene (e.g., TEFLON®); or a combination thereof. The organic vehicle may further optionally include an additive such as a surfactant, a thickener, or a stabilizer, or a combination thereof.

The solvent may be any solvent which is capable of dissolving or suspending any of the above compounds and may include, for example, at least one selected from terpineol, butylcarbitol, butylcarbitol acetate, pentanediol, dipentyne, limonene, ethyleneglycol alkylether, diethyleneglycol alkylether, ethyleneglycol alkylether acetate, diethyleneglycol alkylether acetate, diethyleneglycol dialkylether acetate, triethyleneglycol alkylether acetate, triethyleneglycol alkylether, propyleneglycol alkylether, propyleneglycol phenylether, dipropyleneglycol alkylether, tripropyleneglycol alkylether, propyleneglycol alkylether acetate, dipropyleneglycol alkylether acetate, tripropyleneglycol alkylether acetate, dimethylphthalic acid, diethylphthalic acid, dibutylphthalic acid, and desalted water.

The conductive paste may further include a binder. The binder is a component for improving the adherence with a lower layer, and it may include, for example, one of a glass frit, a metallic glass, and a combination thereof. The metallic glass is a component other than the titanium-based metallic glass.

The organic vehicle may be included in an amount of a balance amount, for example about 0.1 to 50 wt %, based on the total amount of the conductive paste.

The conductive paste may be screen printed to form an electrode for an electronic device, but example embodiments are not limited to screen printing processes to form an electrode.

Hereinafter, an electrode formed using a conductive paste according to example embodiments is described referring to FIG. 3A and FIG. 3C.

Figure 3A:
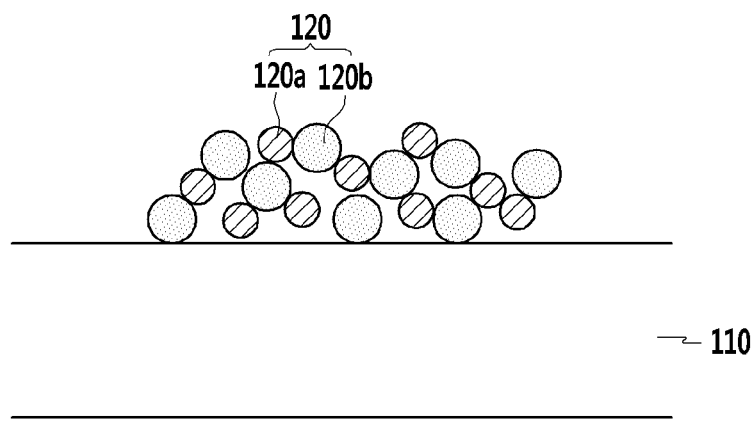
FIG. 3A and FIG. 3C are schematic diagrams showing the process of applying the conductive paste according to example embodiments on a substrate and heating the same.
Figure 3B:
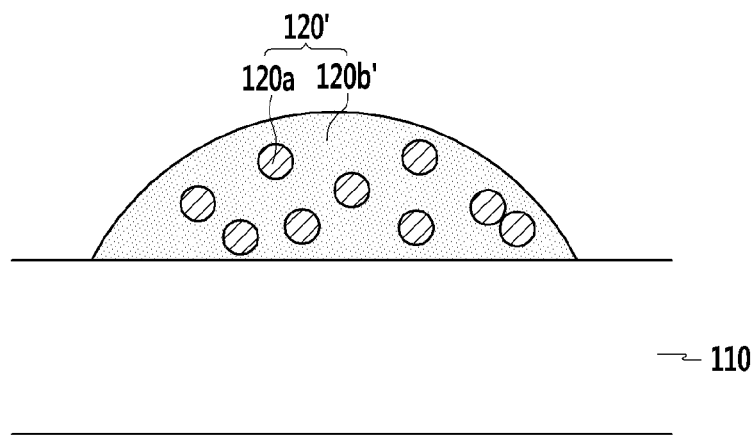
Figure 3C:
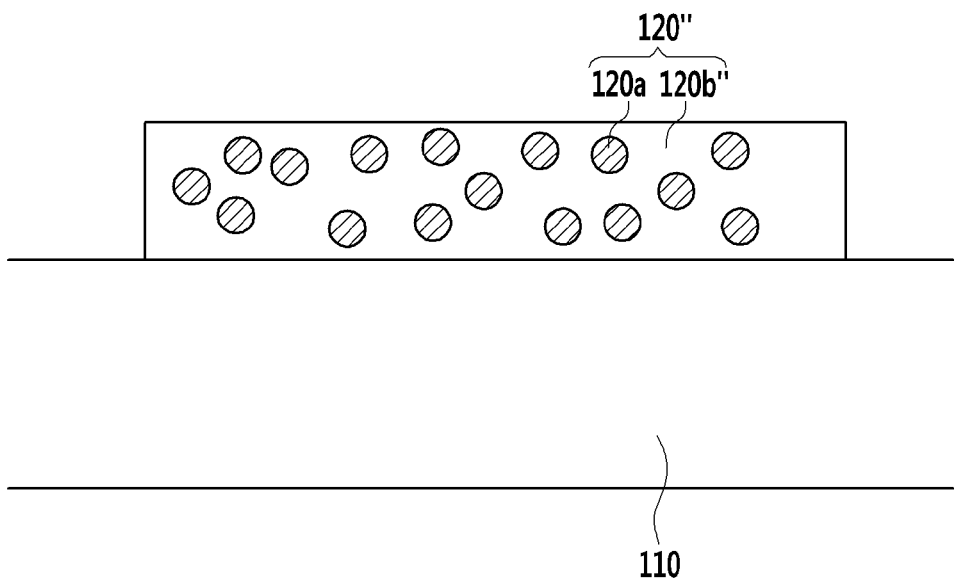

FIG. 3A and FIG. 3C are schematic diagrams showing the process of applying a conductive paste according to example embodiments on a substrate and heating the same to form an electrode according to example embodiments.

Referring to FIG. 3A, a conductive paste 120 including a conductive powder 120a and a titanium-based metallic glass 120b is applied on a substrate 110. Each of the conductive powder 120a and the titanium-based metallic glass 120b may be mixed in a particle state.

Referring to FIG. 3B, when the conductive paste is heated in a process furnace at a temperature above the glass transition temperature (Tg) of the titanium-based metallic glass 120b, the titanium-based metallic glass 120b is softened to show a liquid-like behavior and wettability for the conductive powder 120a. The liquid-behavior metallic glass 120b' fills gaps between conductive powders 120a and electrically connects adjacent conductive powders 120a of the conductive paste 120'.

Subsequently, the conductive paste 120' is fired in a process furnace at a higher temperature, for example, at about 600 to about 1000° C., to provide an electrode.

Referring to FIG. 3C, the electrode 120" may be patterned and shaped into a desired shape and pattern (e.g., rectangle), but example embodiments are not limited thereto.

At least one electrode according to example embodiments may be used as a conductive electrode in various electronic devices.

A representative electronic device is a solar cell, but example embodiments are not limited thereto.

Figure 4:
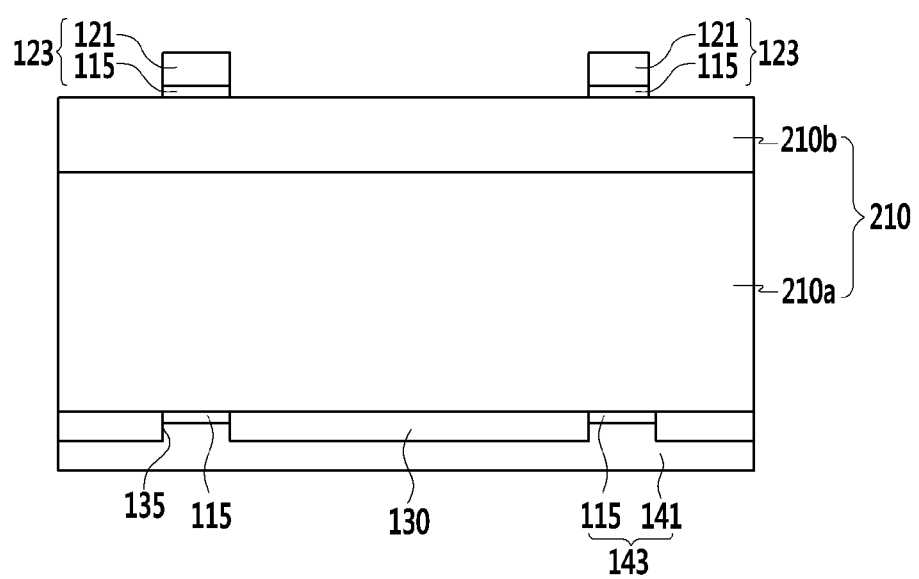
FIG. 4 is a cross-sectional view of a solar cell according to example embodiments.

Referring to FIG. 4, a solar cell according to example embodiments is disclosed in further detail.

FIG. 4 is a cross-sectional view showing a solar cell according to example embodiments.

Hereinafter, the spatial relationship of components will be described with respect to a semiconductor substrate 210 for better understanding and ease of description, but example embodiments are not limited thereto. In addition, a solar energy incident side of a semiconductor substrate 210 is termed a front side, and the opposite side is called a rear side, although alternative configurations are possible.

Referring to FIG. 4, a solar cell according to example embodiments may include a semiconductor substrate 210 including a lower semiconductor layer 210a and an upper semiconductor layer 210b.

The semiconductor substrate 210 may include silicon (e.g., a crystalline silicon) or a compound semiconductor. The crystalline silicon may be, for example, a silicon wafer. Either of the lower semiconductor layer 210a and the upper semiconductor layer 210b may be a semiconductor layer doped with a p-type impurity, while the other may be a semiconductor layer doped with an n-type impurity. For example, the lower semiconductor layer 210a may be a semiconductor layer doped with a p-type impurity, and the upper semiconductor layer 210b may be a semiconductor layer doped with an n-type impurity. Herein, the p-type impurity may be a Group III element such as boron (B), and the n-type impurity may be a Group V element such as phosphorus (P), but example embodiments are not limited thereto.

The surface of the upper semiconductor layer 210b may be textured, and the textured surface may be formed by a surface texturing process. The surface-textured upper semiconductor layer 210b may have protrusions and depressions, and may comprise a pyramidal shape, or may have a porous structure having a honeycomb shape, for example. The surface-textured upper semiconductor layer 210b may have an enhanced surface area to improve the light-absorption rate and to decrease reflectivity, thereby improving efficiency of a solar cell.

At least one front electrode 123 is disposed on the upper semiconductor layer 210b. The front electrode 123 may be arranged in parallel to the direction of the substrate and may have a grid pattern shape to reduce shadowing loss and sheet resistance.

The front electrode 123 may include a buffer layer 115 positioned at a region which is adjacent to the upper semiconductor layer 210b, and a front electrode portion 121 positioned at a region except the buffer layer 115 and including a conductive material. The buffer layer 115 may include one of glass frit, metallic glass, and a combination thereof.

Because the buffer layer 115 has portions that are adjacent to the electrode portion 121 and the upper semiconductor layer 210b, it may decrease loss of electric charges by enlarging the effective path for transferring electric charges between the upper semiconductor layer 210b and the front electrode portion 121. The buffer layer 115 may also reduce resistive losses, for example.

However, example embodiments are not limited thereto. The buffer layer 115 may be omitted, or may be formed on a part of a region which is adjacent to the upper semiconductor layer 210b.

The front electrode 123 may be formed by screen printing a conductive paste according to example embodiments.

A bus bar electrode (not shown) may be disposed on the front electrode 123. The bus bar electrode can connect adjacent solar cells of a plurality of solar cells.

A dielectric layer 130 may be disposed under the semiconductor substrate 210. The dielectric layer 130 may increase efficiency of a solar cell by reducing (and/or preventing) recombination of electric charges and leaking of electric current. The dielectric layer 130 may include a through-hole 135. Through the through-hole 135, a rear electrode 143, which is further disclosed below, may contact the semiconductor substrate 210.

The dielectric layer 130 may comprise silicon oxide ($SiO_2$), silicon nitride ($SiN_x$), aluminum oxide ($Al_2O_3$), or a combination thereof, and may have a thickness of about 100 to about 2000 angstroms (Å).

A rear electrode 143 is disposed under the dielectric layer 130. The rear electrode 143 may include a conductive material, for example, an opaque metal such as aluminum (Al). The rear electrode 143 may be formed using a screen printing method using a conductive paste according to example embodiments in the same manner as the front electrode 123. A conductive paste used for the front electrode 123 may be the same as or different than a conductive paste used for the rear electrode 143.

The rear electrode 143 may include a buffer layer 115 positioned at a region which is adjacent to a lower semiconductor layer 210a, and a rear electrode portion 141 positioned at a region except the buffer layer 115 and including a conductive material in the same manner as the front electrode 123.

However, example embodiments are not limited thereto. The buffer layer 115 may be omitted, or may be formed on a part of a region which is adjacent to the lower semiconductor layer 210a.

Hereinafter, a method of manufacturing the solar cell is further disclosed with reference to FIG. 4.

First, prepared is a semiconductor substrate 210, which may be a silicon wafer, for example. The semiconductor substrate 210 may be doped with a p-type impurity, for example.

Then, the semiconductor substrate 210 may be subjected to a surface texturing treatment. The surface-texturing treatment may be performed with a wet method using a strong acid such as nitric acid, or hydrofluoric acid, or a strong base such as sodium hydroxide, or by a dry method, such as plasma treatment.

Then, the semiconductor substrate 210 may be doped with an n-type impurity, for example. The n-type impurity may be doped by diffusing $POCl_3$, or $H_3PO_4$, or the like at a high temperature. The semiconductor substrate 210 includes a lower semiconductor layer 210a and an upper semiconductor layer 210b doped with different impurities from each other.

Then, a conductive paste according to example embodiments for a front electrode is applied on the upper semiconductor layer 210b. The conductive paste for a front electrode includes a conductive component such as a conductive powder and a titanium-based metallic glass, and an organic vehicle, and is applied using a screen printing method.

The titanium-based metallic glass may be prepared using any suitable method, such as melt spinning, infiltration casting, gas atomization, ion irradiation, or mechanical alloying.

Then, the conductive paste for a front electrode may be dried.

A dielectric layer 130 may be provided by laminating aluminum oxide (e.g., $Al_2O_3$) or silicon oxide (e.g., $SiO_2$) on the rear side of the semiconductor substrate 210, for example, in a plasma enhanced chemical vapor deposition ("PECVD") method.

Then, a through-hole 135 may be provided on a portion of the dielectric layer 130 by ablation with a laser, for example.

The conductive paste according to example embodiments for a rear electrode is subsequently applied on a side of the dielectric layer 130 using a screen printing method.

The conductive paste for a rear electrode is then dried

The conductive pastes for the front and the rear electrodes are heat treated, i.e., co-fired at the same time. The conductive pastes for the front and the rear electrodes may be heat-treated individually. The conductive pastes used for the front and the rear electrodes may be the same or different.

The firing may be performed at a temperature which is higher than the melting temperature of the conductive component in a furnace, for example, at a temperature ranging from about 600° C. to about 1000° C.

Hereinafter, a solar cell according to example embodiments is disclosed referring to FIG. 5.

Figure 5:
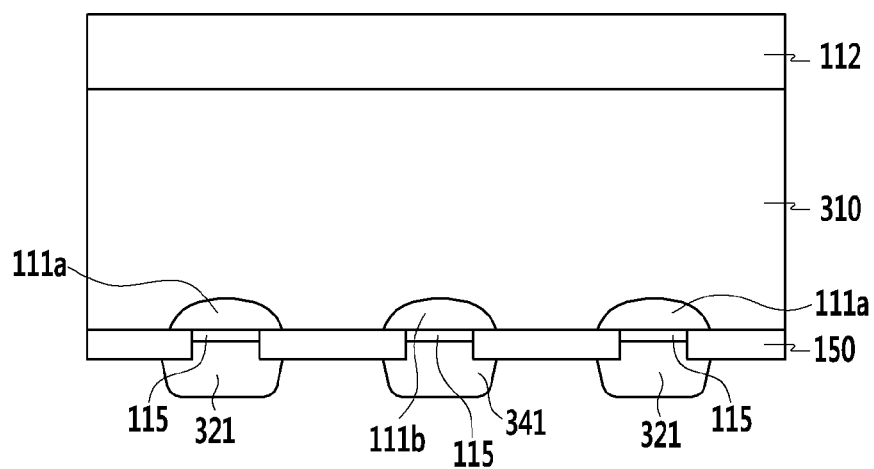
FIG. 5 is a cross-sectional view of another solar cell according to example embodiments.

FIG. 5 is a cross-sectional view showing a solar cell according to example embodiments.

A solar cell may include a semiconductor substrate 310 doped with a p-type or an n-type impurity.

The semiconductor substrate 310 may include a first doping region 111a and second doping region 111b. The first doping region 111a and second doping region 111b are provided on the rear side of the semiconductor substrate 310 and are doped with different impurities than each other. For example, the first doping region 111a may be doped with an n-type impurity, and the second doping region 111b may be doped with a p-type impurity. The first doping region 111a and the second doping region 111b may be alternately doped with a p-type impurity and a n-type impurity, respectively.

The front side of the semiconductor substrate 310 may be surface-textured, and therefore may enhance the light-absorption rate and decrease the reflectivity, thereby improving efficiency of a solar cell.

An insulation layer 112 is provided on the semiconductor substrate 310. The insulation layer 112 may be may comprise an insulating material, for example one of silicon nitride ($SiN_x$), silicon oxide ($SiO_2$), titanium oxide ($TiO_2$), aluminum oxide ($Al_2O_3$), magnesium oxide (MgO), cerium oxide ($CeO_2$), and a combination thereof. The insulation layer 112 may be a single layer or more than one layer. The insulation layer 112 may have a thickness ranging from about 200 to about 1500 Å, but example embodiments are not limited thereto.

The insulation layer 112 may be an anti-reflective coating ("ARC") that decreases the reflectivity of light and increases selectivity of a particular wavelength region on the surface of the solar cell, and simultaneously improves properties of silicon on the surface of the semiconductor substrate 310, thereby increasing efficiency of the solar cell.

A dielectric layer 150 including a plurality of through-hole may be disposed on the rear side of the semiconductor substrate 310.

The first electrode electrically connected with the first doping region 111a and the second electrode electrically connected with the second doping region 111b are disposed on the rear side of the semiconductor substrate 310, respectively. The first electrode and the first doping region 111a may be contacted through a through-hole, and the second electrode and the second doping region 111b may be in contact through a through-hole. The first electrode and the second electrode may be alternately disposed.

The first electrode may include a buffer layer 115 positioned at a region which is adjacent to the first doping region 111a, and a first electrode portion 321 positioned at a region except the buffer layer 115. The second electrode may include a buffer layer 115 positioned at a region which is adjacent to the second doping region 111b, and a second electrode portion 341 positioned at a region except the buffer layer 115.

However, example embodiments are not limited thereto. The buffer layer 115 may be omitted, or may be formed on a part of a region which is adjacent to the first doping region 111a, a part of a region which is adjacent to the second doping region 111b, or a combination thereof.

As described above, the first electrode and the second electrode may be disposed using a conductive paste according to example embodiments including a conductive component including a conductive powder and a metallic glass, and an organic vehicle, as described above.

A solar cell according to example embodiments includes both of the first electrode and the second electrode on the rear surface of the solar cell unlike the solar cell described above. Thereby, an area where a metal is disposed on the front surface may be decreased and shadowing loss decreases and solar cell efficiency increases.

Hereinafter, the method of manufacturing a solar cell will be further disclosed referring to FIG. 5.

First, a semiconductor substrate 310 doped with, for example, an n-type impurity is prepared. Then, the semiconductor substrate 310 is surface-textured, and insulation layer 112 and dielectric layer 150 are disposed on a front side and a rear side of the semiconductor substrate 310, respectively. The insulation layer 112 and the dielectric layer 150, may be provided by chemical vapor deposition ("CVD"), for example.

Then, the first doping region 111a and the second doping region 111b may be disposed by sequentially doping a p-type impurity and an n-type impurity at a high concentration on the rear side of the semiconductor substrate 310.

Then, a conductive paste according to example embodiments for a first electrode is applied on a portion of the dielectric layer 150 corresponding to the first doping region 111a, and a conductive paste for a second electrode is applied on a portion of the dielectric layer 150 corresponding to the second doping region 111b. The conductive paste according to example embodiments for the first electrode and the conductive paste for the second electrode may be disposed by a screen printing method, for example, wherein the conductive paste may includes a conductive component including a conductive powder and a metallic glass, and an organic vehicle.

A conductive paste for the first electrode and A conductive paste for the second electrode may be fired together or separately. The firing may be performed in a furnace at a temperature which is higher than the melting temperature of a conductive powder. According to example embodiments, a conductive paste for the first electrode may be the same as or different than a conductive paste for the second electrode.

Herein, a conductive paste according to example embodiments is applied to provide an electrode for a solar cell, but the conductive paste may be used for an electrode for other electronic devices, such as a plasma display panel ("PDP"), a liquid crystal display ("LCD"), and a light emitting diode (e.g., an organic light emitting diode ("OLED")).

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

What is claimed is:

1. A conductive paste comprising:
    a conductive component containing a conductive powder and a titanium (Ti)-based metallic glass,
        the titanium-based metallic glass having a supercooled liquid region of about 5K or more,
        the titanium-based metallic glass having a resistivity after crystallization that is less than a resistivity before crystallization by about 50% or more, and
        the titanium-based metallic glass having a weight increase by about 0.5 mg/cm$^2$ or less after being heated in process furnace at a firing temperature.

2. The conductive paste of claim 1, wherein
    the titanium-based metallic glass has a supercooled liquid region of about 5 to about 200K.

3. The conductive paste of claim 1, wherein
    the titanium-based metallic glass has resistivity after crystallization of about 200 μΩcm or less.

4. The conductive paste of claim 3, wherein the titanium-based metallic glass is crystallized by heating in a process furnace at about 300 to about 800° C. in air.

5. The conductive paste of claim 1, wherein the firing temperature is about 300 to about 1000° C.

6. The conductive paste of claim 1, wherein the titanium-based metallic glass includes one of $Ti_{50}Cu_{50}$, $Ti_{57}Cu_{43}$, $Ti_{49.75}Cu_{49.75}Al_{0.5}$, $Ti_{49.5}Cu_{49.5}Al_1$, $Ti_{49}Cu_{49}Al_2$, $Ti_{49.75}Cu_{49.75}Nb_{0.5}$, $Ti_{49.5}Cu_{49.5}Nb_1$, $Ti_{49}Cu_{49}Nb_2$, $Ti_{50}Cu_{35}Ni_{15}$, $Ti_{50}Cu_{30}Ni_{15}Sn_5$, $Ti_{50}Cu_{25}Ni_{15}Sn_5Zr_5$, $Ti_{50}Cu_{42.5}Ni_{7.5}$, $Ti_{47.5}Cu_{42.5}Ni_{7.5}Zr_{2.5}$, $Ti_{45}Cu_{40}Ni_5Sn_5Zr_5$, and a combination thereof.

7. The conductive paste of claim 1, wherein the conductive powder includes at least one of silver (Ag), silver (Ag) alloy, aluminum (Al), aluminum (Al) alloy, copper (Cu), copper (Cu) alloy, nickel (Ni), nickel (Ni) alloy, and a combination thereof.

8. The conductive paste of claim 1, wherein
    the conductive powder and titanium-based metallic glass are included in amounts of about 5 wt % to about 95 wt % and about 5 wt % to about 95 wt %, respectively, based on the total amount of the conductive component.

9. The conductive paste of claim 1, further comprising a binder.

10. The conductive paste of claim 9, wherein the binder includes one of glass frit, metallic glass, and a combination thereof.

11. The conductive paste of claim 1, wherein the titanium-based metallic glass includes a composition represented by the formula, $Ti_xCu_yM_z$, wherein
    x is a number ranging from about 45.0 to about 60.0,
    y is a number ranging from about 25.0 to about 50.0,
    M is an element including one of aluminum (Al), and niobium (Nb),
    z in a number ranging from about 0.5 to about 15.0, and
    the sum of x, y, and z is equal to or less than 100.

12. The conductive paste of claim 11, wherein
    the titanium-based metallic glass is an amorphous alloy including titanium (Ti) as a main component and at least one element other than titanium, and
    the at least one element other than titanium includes at least one of silicon (Si), silver (Ag), gold (Au), calcium (Ca), beryllium (Be), magnesium (Mg), sodium (Na), molybdenum (Mo), tungsten (W), zinc (Zn), potassium (K), lithium (Li), iron (Fe), palladium (Pd), platinum (Pt), rubidium (Rb), chromium (Cr), and strontium (Sr).

13. An electrode comprising:
    a fired product of the conductive paste according to claim 1.

14. An electronic device comprising:
    at least one electrode including a fired product of the conductive paste of claim 1.

15. The electronic device of claim 14, wherein the titanium-based metallic glass has a supercooled liquid region of about 5 to about 200 K and resistivity after crystallization of about 200 μΩcm or less.

16. The electronic device of claim 14, wherein the titanium-based metallic glass includes one of $Ti_{50}Cu_{50}$, $Ti_{57}Cu_{43}$, $Ti_{49.75}Cu_{49.75}Al_{0.5}$, $Ti_{49.5}Cu_{49.5}Al_1$, $Ti_{49}Cu_{49}Al_2$, $Ti_{49.75}Cu_{49.75}Nb_{0.5}$, $Ti_{49.5}Cu_{49.5}Nb_1$, $Ti_{49}Cu_{49}Nb_2$, $Ti_{50}Cu_{35}Ni_{15}$, $Ti_{50}Cu_{30}Ni_{15}Sn_5$, $Ti_{50}Cu_{25}Ni_{15}Sn_5Zr_5$, $Ti_{50}Cu_{42.5}Ni_{7.5}$, $Ti_{47.5}Cu_{42.5}Ni_{7.5}Zr_{2.5}$, $Ti_{45}Cu_{40}Ni_5Sn_5Zr_5$, and a combination thereof.

17. The electronic device of claim 14, wherein the conductive powder and the titanium-based metallic glass are included in amounts of about 5 wt % to about 95 wt % and about 5 wt % to about 95 wt % based on the total amount of the conductive component.

18. A solar cell comprising
    a semiconductor layer, and
    at least one electrode electrically connected to the semiconductor layer, the at least one electrode including a fired product of the conductive paste according to claim 1.

19. The solar cell of claim 18, wherein the titanium-based metallic glass has a supercooled liquid region of about 5 to about 200K.

20. The solar cell of claim 18, wherein the titanium-based metallic glass has a resistivity after crystallization of about 200 μΩcm or less.

21. The solar cell of claim 18, wherein the titanium-based metallic glass includes one of $Ti_{50}Cu_{50}$, $Ti_{57}Cu_{43}$, $Ti_{49.75}Cu_{49.75}Al_{0.5}$, $Ti_{49.5}Cu_{49.5}Al_{1}$, $Ti_{49}Cu_{49}Al_{2}$, $Ti_{49.75}Cu_{49.75}Nb_{0.5}$, $Ti_{49.5}Cu_{49.5}Nb_{1}$, $Ti_{49}Cu_{49}Nb_{2}$, $Ti_{50}Cu_{35}Ni_{15}$, $Ti_{50}Cu_{30}Ni_{15}Sn_{5}$, $Ti_{50}Cu_{25}Ni_{15}Sn_{5}Zr_{5}$, $Ti_{50}Cu_{42.5}Ni_{7.5}$, $Ti_{47.5}Cu_{42.5}Ni_{7.5}Zr_{2.5}$, $Ti_{45}Cu_{40}Ni_{5}Sn_{5}Zr_{5}$, and a combination thereof.

22. The solar cell of claim 18, wherein the conductive powder includes one of silver (Ag), aluminum (Al), copper (Cu), nickel (Ni), and a combination thereof.

23. The solar cell of claim 18, wherein
the at least one electrode includes a buffer layer adjacent to one region of the semiconductor layer, and
an electrode portion electrically connected to another region of the semiconductor layer.

24. The solar cell of claim 23, wherein the buffer layer includes one of glass frit, metallic glass, and a combination thereof.

* * * * *

UNITED STATES PATENT AND TRADEMARK OFFICE
CERTIFICATE OF CORRECTION

| | | |
|---|---|---|
| PATENT NO. | : 9,039,943 B2 | Page 1 of 1 |
| APPLICATION NO. | : 13/404399 | |
| DATED | : May 26, 2015 | |
| INVENTOR(S) | : Se Yun Kim et al. | |

It is certified that error appears in the above-identified patent and that said Letters Patent is hereby corrected as shown below:

On the title page item 73

The correct second Assignee of the invention should read "Industry-Academic Cooperation Foundation, Yonsei University".

Signed and Sealed this
Ninth Day of February, 2016

Michelle K. Lee
*Director of the United States Patent and Trademark Office*